United States Patent
Jang

(10) Patent No.: US 10,170,647 B2
(45) Date of Patent: Jan. 1, 2019

(54) SOLAR CELL AND METHOD FOR MANUFACTURING THE SAME

(71) Applicant: LG ELECTRONICS INC., Seoul (KR)

(72) Inventor: Daehee Jang, Seoul (KR)

(73) Assignee: LG ELECTRONICS INC., Seoul (KR)

(*) Notice: Subject to any disclaimer, the term of this patent is extended or adjusted under 35 U.S.C. 154(b) by 854 days.

(21) Appl. No.: 14/555,850

(22) Filed: Nov. 28, 2014

(65) Prior Publication Data
US 2015/0155405 A1    Jun. 4, 2015

(30) Foreign Application Priority Data

Nov. 29, 2013   (KR) ........................ 10-2013-0147793

(51) Int. Cl.
| | |
|---|---|
| *H01L 31/0224* | (2006.01) |
| *H01L 31/05* | (2014.01) |
| *H01L 31/048* | (2014.01) |
| *H01L 31/068* | (2012.01) |
| *H01L 31/02* | (2006.01) |

(Continued)

(52) U.S. Cl.
CPC ............ *H01L 31/022441* (2013.01); *H01L 31/02013* (2013.01); *H01L 31/02327* (2013.01); *H01L 31/0516* (2013.01); *H01L 31/0682* (2013.01); *H01L 31/18* (2013.01); Y02E 10/52 (2013.01); Y02E 10/547 (2013.01)

(58) Field of Classification Search
CPC ....... H01L 31/022441; H01L 31/02013; H01L 31/02327; H01L 31/0516; H01L 31/0682; H01L 31/18

USPC .................................................. 136/242–265
See application file for complete search history.

(56) References Cited

U.S. PATENT DOCUMENTS

| | | | |
|---|---|---|---|
| 2008/0041437 A1 | 2/2008 | Yamaguchi | |
| 2012/0167940 A1* | 7/2012 | Toya ................. | H01L 31/0516 136/244 |

(Continued)

FOREIGN PATENT DOCUMENTS

| | | |
|---|---|---|
| DE | 102008040332 A1 | 1/2010 |
| EP | 2216827 A1 | 8/2010 |

(Continued)

*Primary Examiner* — Magali P Slawski
*Assistant Examiner* — Kourtney R S Carlson
(74) *Attorney, Agent, or Firm* — Birch, Stewart, Kolasch & Birch, LLP

(57) ABSTRACT

A solar cell and a method for manufacturing the same are discussed. The solar cell includes a semiconductor substrate, a plurality of first and second electrodes which are formed on a back surface of the semiconductor substrate to be separated from each other, and an insulating member including a first auxiliary electrode connected to the first electrodes and a second auxiliary electrode connected to the second electrodes. The first electrodes and the first auxiliary electrode are connected using a conductive adhesive including a resin layer and conductive metal particles, and the second electrodes and the second auxiliary electrode are connected using the conductive adhesive. The first and second electrodes are insulated from each other through an insulating layer, or the first and second auxiliary electrodes are insulated from each other through the insulating layer.

9 Claims, 11 Drawing Sheets

(51) Int. Cl.
H01L 31/0232 (2014.01)
H01L 31/18 (2006.01)

(56) References Cited

U.S. PATENT DOCUMENTS

| | | | |
|---|---|---|---|
| 2013/0174886 A1* | 7/2013 | Furukawa | C09J 7/0203 136/244 |
| 2013/0298988 A1 | 11/2013 | Fukuda et al. | |

FOREIGN PATENT DOCUMENTS

| | | |
|---|---|---|
| EP | 2 439 784 A1 | 4/2012 |
| EP | 2 479 802 A1 | 7/2012 |
| EP | 2 615 146 A2 | 7/2013 |
| JP | 4-115407 A | 4/1992 |
| JP | 2004-363434 A | 12/2004 |
| JP | 2008-26386 A | 2/2008 |
| JP | 2009-88145 A | 4/2009 |
| JP | 2011-114153 A | 6/2011 |
| JP | 2012-69592 A | 4/2012 |
| JP | 2012-99569 A | 5/2012 |
| JP | 2012-129461 A | 7/2012 |
| JP | 2013-26378 A | 2/2013 |
| JP | 5232944 B1 | 7/2013 |
| JP | 2013-214603 A | 10/2013 |
| WO | WO 2013/005475 A1 | 1/2013 |

\* cited by examiner (a)

(b)

SOLAR CELL AND METHOD FOR MANUFACTURING THE SAME

CROSS-REFERENCE TO RELATED APPLICATION

This application claims priority to and the benefit of Korean Patent Application No. 10-2013-0147793 filed in the Korean Intellectual Property Office on Nov. 29, 2013, the entire contents of which are incorporated herein by reference.

BACKGROUND OF THE INVENTION

Field of the Invention

Embodiments of the invention relate to a solar cell and a method for manufacturing the same.

Description of the Related Art

A solar cell generally includes a substrate and an emitter region, which are formed of semiconductors of different conductive types, for example, a p-type and an n-type, and electrodes respectively connected to the substrate and the emitter region. A p-n junction is formed at an interface between the substrate and the emitter region.

In particular, a solar cell, in which electrodes are not formed on a light receiving surface of a silicon substrate and n-type electrodes and p-type electrodes are formed only on another surface of the silicon substrate, has been continuously studied and developed so as to increase efficiency of the solar cell. Further, a module technology for electrically connecting the plurality of solar cells has been continuously studied and developed.

Examples of the module technology typically include a method for electrically connecting the plurality of solar cells using metal interconnectors and a method for electrically connecting the plurality of solar cells using a wiring substrate, on which wirings are previously formed.

SUMMARY OF THE INVENTION

In one aspect, there is a solar cell including a semiconductor substrate, a plurality of first electrodes and a plurality of second electrodes which are formed to be separated from each other on a back surface of the semiconductor substrate, and an insulating member including a first auxiliary electrode connected to the plurality of first electrodes and a second auxiliary electrode connected to the plurality of second electrodes, wherein the plurality of first electrodes and the first auxiliary electrode are connected to each other using a conductive adhesive including a resin layer and conductive metal particles distributed in the resin layer, and the plurality of second electrodes and the second auxiliary electrode are connected to each other using the conductive adhesive, wherein the plurality of first and second electrodes are insulated from each other through an insulating layer, or the first and second auxiliary electrodes are insulated from each other through the insulating layer, wherein the resin layer included in the conductive adhesive and the insulating layer contain the same resin material.

The resin layer of the conductive adhesive and the insulating layer may contain at least one of an epoxy-based resin, an acrylic-based resin, and a silicon-based resin.

One semiconductor substrate and one insulating member may be connected to form an individual integrated type element.

The insulating layer may include light reflection particles to reflect incident light. The light reflection particles may be formed of titanium oxide ($TiO_2$) particles or phosphor particles.

A size of each conductive metal particle may be 0.1 μm to 15 μm. The conductive metal particles may contain at least one of silver (Ag), nickel (Ni), copper (Cu), gold (Au), and aluminum (Al).

The insulating layer may include a plurality of conductive metal particles which are positioned to be separated from one another.

The first auxiliary electrode may include a first connector connected to the first electrodes and a first pad, one end of which is connected to an end of the first connector. The second auxiliary electrode may include a second connector connected to the second electrodes and a second pad, one end of which is connected to an end of the second connector.

An interconnector for connecting adjacent solar cells may be connected to the first pad and the second pad.

In another aspect, there is a method for manufacturing a solar cell including preparing a semiconductor substrate, on which a plurality of first electrodes and a plurality of second electrodes are formed to be separated from each other on its back surface, and preparing an insulating member, on which a first auxiliary electrode and a second auxiliary electrode are formed to be separated from each other on its front surface, and connecting the semiconductor substrate to the insulating member through one thermal process to obtain a connection of the plurality of first electrodes to the first auxiliary electrode and to obtain a connection of the plurality of second electrodes to the second auxiliary electrode, wherein in the connecting, the connection between the plurality of first electrodes and the first auxiliary electrode and the connection between the plurality of second electrodes and the second auxiliary electrode are obtained using a conductive adhesive paste including a resin layer and a plurality of conductive metal particles, and an insulating layer paste including an insulating resin layer connects the plurality of first and second electrodes or connects the first and second auxiliary electrodes, wherein the resin layer of the conductive adhesive paste and the insulating resin layer of the insulating layer paste are simultaneously hardened or semi-hardened through one thermal process.

A thermal expansion coefficient of the resin layer included in the conductive adhesive paste may be equal to a thermal expansion coefficient of the insulating resin layer included in the insulating layer paste.

The resin layer of the conductive adhesive paste and the insulating resin layer of the insulating layer paste may contain the same resin material.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It should be noted that a detailed description of known arts will be omitted if it is determined that the arts can obscure the embodiments of the invention.

In the following description, "front surface" may be one surface of a solar cell, on which light is directly incident, and "back surface" may be a surface opposite the one surface of the solar cell, on which light is not directly incident or reflective light may be incident.

Exemplary embodiments of the invention will be described with reference to FIGS. 1 to 9.

Figure 1:
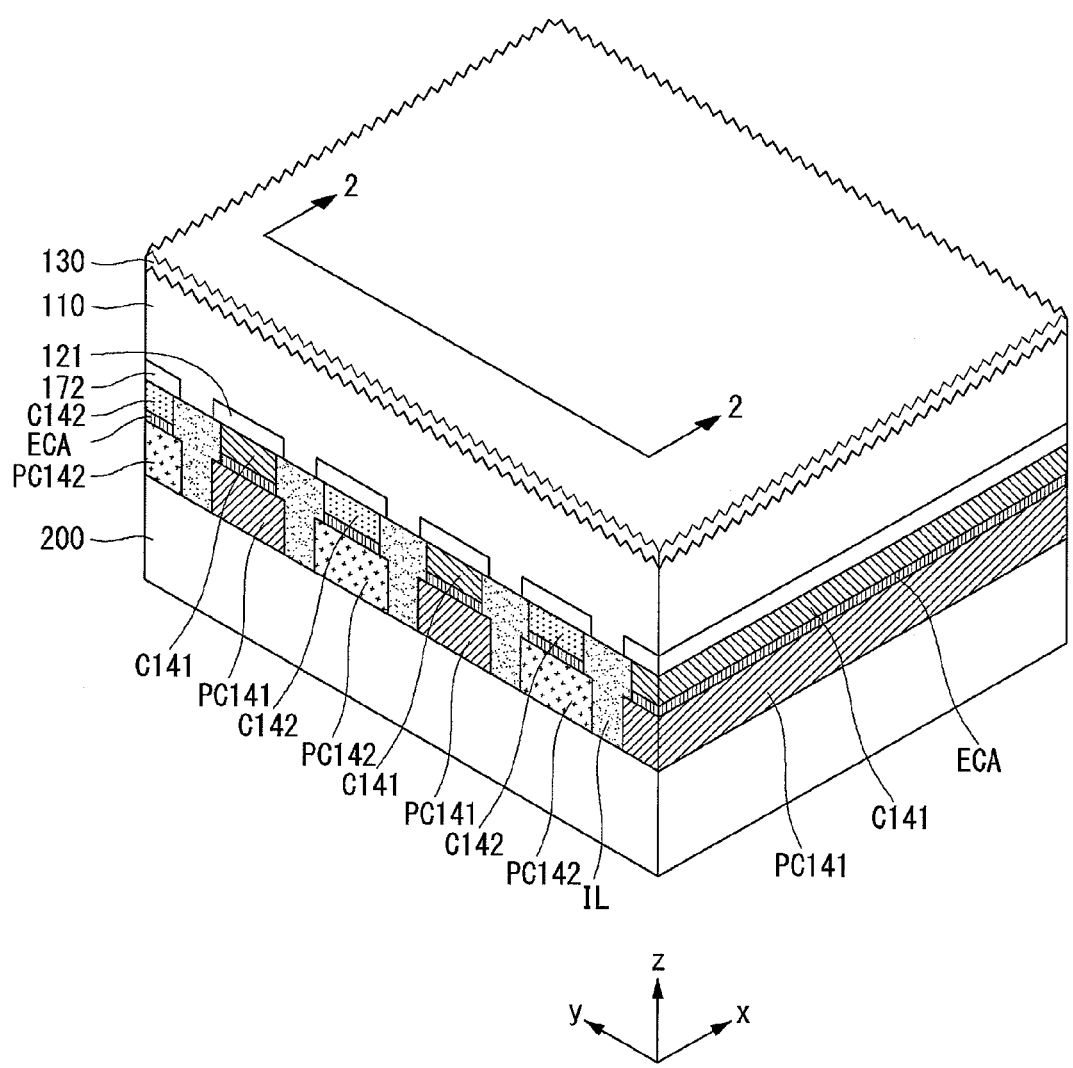
FIGS. 1 and 2 illustrate a solar cell according to an example embodiment of the invention.
Figure 2:
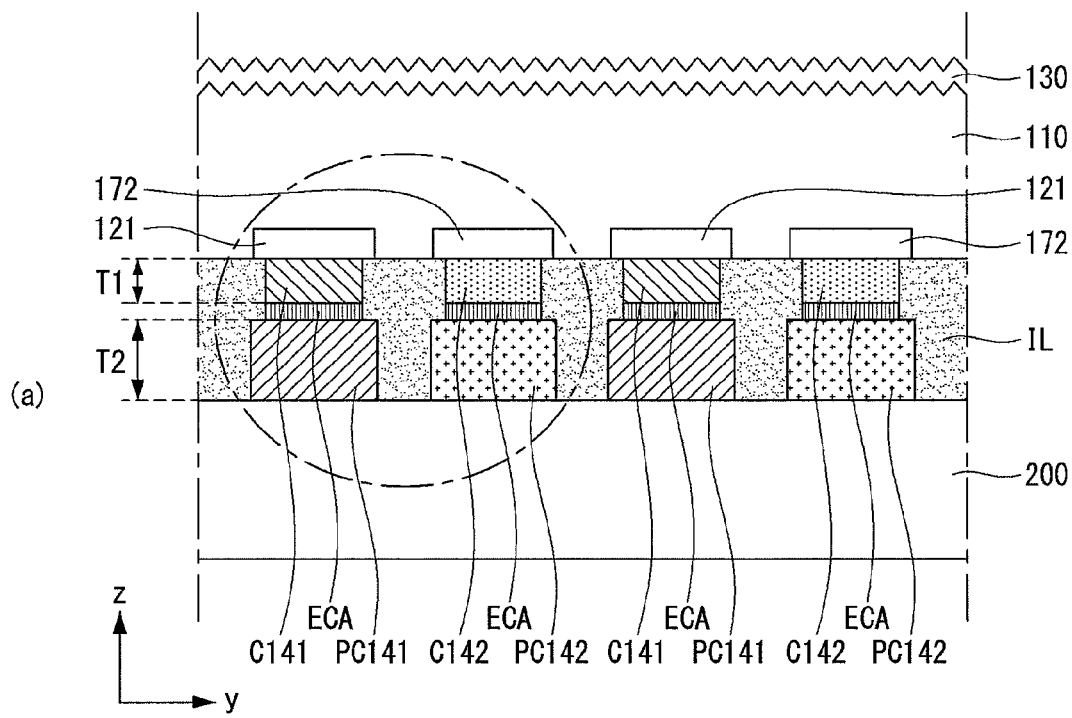
Figure 2:
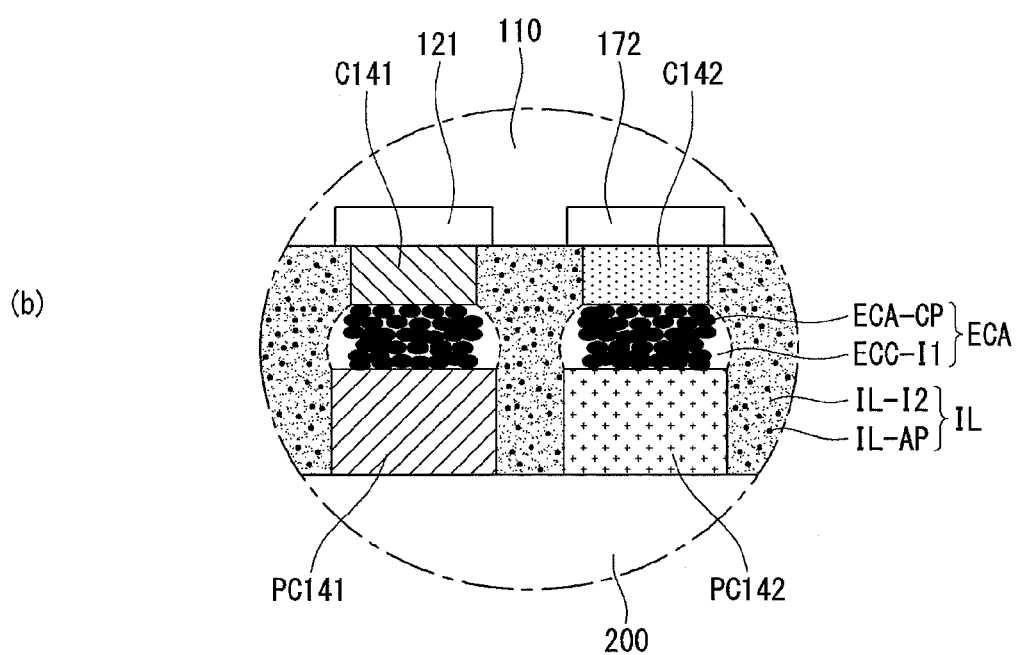
Figure 3:
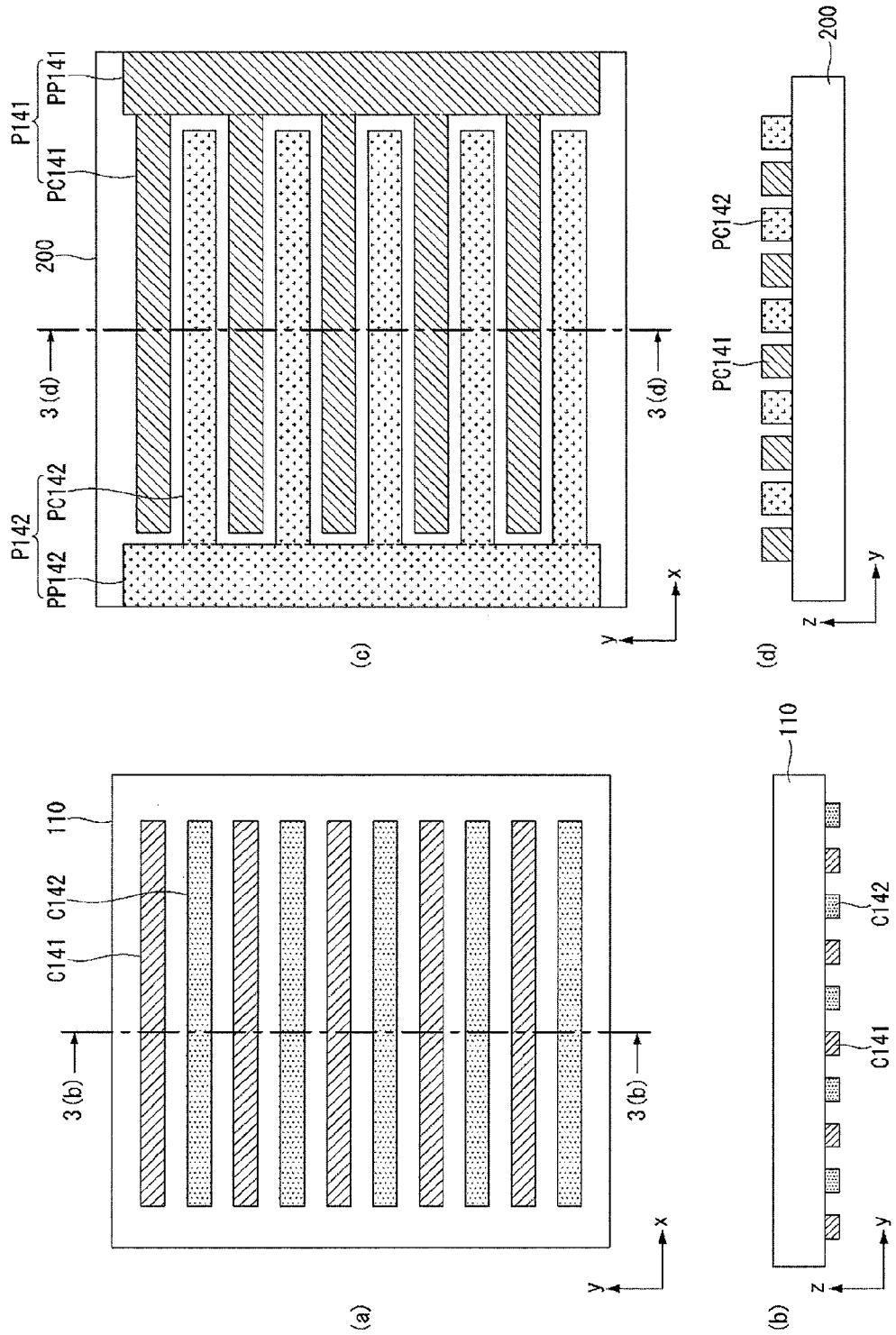
FIG. 3 shows an example of an electrode pattern of each of a semiconductor substrate and an insulating member in the solar cell shown in FIGS. 1 and 2.

FIGS. 1 to 3 illustrate a solar cell according to an example embodiment of the invention.

More specifically, FIG. 1 is a partial perspective view of a solar cell according to the embodiment of the invention. In FIG. 2, (a) is a cross-sectional view taken along line 2-2 of FIG. 1, and (b) is an enlarged view of an electrode shown in (a) of FIG. 2.

Further, FIG. 3 shows an example of an electrode pattern of each of a semiconductor substrate and an insulating member in the solar cell shown in FIGS. 1 and 2. In FIG. 3, (a) shows an example of a pattern of first and second electrodes formed on a back surface of a semiconductor substrate; (b) is a cross-sectional view taken along line 3(b)-3(b) of (a) of FIG. 3; (c) shows an example of a pattern of first and second auxiliary electrodes formed on a front surface of an insulating member; and (d) is a cross-sectional view taken along line 3(d)-3(d) of (c) of FIG. 3.

As shown in FIGS. 1 and 2, a solar cell according to the embodiment of the invention may include a semiconductor substrate 110, an anti-reflection layer 130, an emitter region 121, a back surface field (BSF) region 172, a plurality of first electrodes C141, a plurality of second electrodes C142, a first auxiliary electrode P141 (see FIG. 3, for example), a second auxiliary electrode P142 (see FIG. 3 for example), and an insulating member 200.

The anti-reflection layer 130 and the back surface field region 172 may be omitted in the embodiment of the invention. The solar cell according to the embodiment of the invention may further include a front surface field region positioned between the anti-reflection layer 130 and the semiconductor substrate 110, on which light is incident. The front surface field region is an impurity region which is more heavily doped than the semiconductor substrate 110 with impurities of the same conductive type as the semiconductor substrate 110.

Hereinafter, the embodiment of the invention describes the solar cell including the anti-reflection layer 130 and the back surface field region 172, as an example, as shown in FIGS. 1 and 2.

The semiconductor substrate 110 may be a bulk type semiconductor substrate formed of silicon containing impurities of a first conductive type, for example, an n-type, though not required. The semiconductor substrate 110 may be formed by doping a wafer formed of silicon material with impurities of the first conductive type.

A front surface of the semiconductor substrate 110 may be textured to form a textured surface corresponding to an uneven surface having a plurality of uneven portions or having uneven characteristics. The anti-reflection layer 130 may be positioned on the front surface of the semiconductor substrate 110 and may include one layer or a plurality of layers. The anti-reflection layer 130 may be formed of hydrogenated silicon nitride (SiNx:H). Other materials may be used. The front surface field region may be additionally formed at the front surface of the semiconductor substrate 110.

The emitter region 121 may be positioned to be separated from one another inside a back surface opposite the front surface of the semiconductor substrate 110 and may extend in parallel with one another. Namely, the emitter region 121 may be in plural. The plurality of emitter regions 121 may be of a second conductive type (for example, p-type) opposite the first conductive type (for example, n-type) of the semiconductor substrate 110.

The plurality of emitter regions 121 may heavily contain impurities of the second conductive type (for example, p-type) opposite the first conductive type (for example, n-type) of the semiconductor substrate 110 formed of crystalline silicon and may be formed through a diffusion process.

The plurality of back surface field regions 172 may be positioned inside the back surface of the semiconductor substrate 110. The plurality of back surface field regions 172 may be positioned to be separated from one another in a direction parallel to the emitter regions 121 and may extend in the same direction as the emitter regions 121. Thus, as shown in FIGS. 1 and 2, the plurality of emitter regions 121 and the plurality of back surface field regions 172 may be alternately positioned at the back surface of the semiconductor substrate 110.

Each back surface field region 172 may be a region (for example, an $n^{++}$-type region) which is more heavily doped than the semiconductor substrate 110 with impurities of the same conductive type as the semiconductor substrate 110. The plurality of back surface field regions 172 may heavily contain impurities (for example, $n^{++}$-type impurities) of the same conductive type as the semiconductor substrate 110 formed of crystalline silicon and may be formed through a diffusion process or a deposition process.

The plurality of first electrodes C141 are physically and electrically connected to the plurality of emitter regions 121, respectively, extend along the plurality of emitter regions 121, and are separated from one another. Thus, when the emitter regions 121 extend in a first direction x (for example, an x-axis direction), the first electrodes C141 may extend in the first direction x. Further, when the emitter regions 121 extend in a second direction y (for example, a y-axis direction), the first electrodes C141 may extend in the second direction y.

The plurality of second electrodes C142 are physically and electrically connected to the semiconductor substrate 110 through the plurality of back surface field regions 172 and extend along the plurality of back surface field regions 172.

Thus, when the back surface field regions 172 extend in the first direction x, the second electrodes C142 may extend in the first direction x. Further, when the back surface field regions 172 extend in the second direction y, the second electrodes C142 may extend in the second direction y.

The first electrodes C141 and the second electrodes C142 may be physically and electrically separated from each other on the back surface of the semiconductor substrate 110.

The first electrode C141 formed on the emitter region 121 may collect carriers (for example, holes) moving to the emitter region 121, and the second electrode C142 formed on the back surface field region 172 may collect carriers (for example, electrons) moving to the back surface field region 172.

As shown in FIG. 3, the first auxiliary electrode P141 may include a first connector PC141 and a first pad PP141. As shown in FIGS. 1 and 2, the first connector PC141 may be connected to the plurality of first electrodes C141. Further, as shown in FIG. 3, one end of the first pad PP141 may be connected to an end of the first connector PC141, and the other end may be connected to an interconnector IC. The first connector PC141 may be formed in a direction crossing the first pad PP141. For example, the first connector PC141 may be formed perpendicular to the first pad PP141.

Namely, the first connector PC141 may be formed in the plural, and thus the plurality of first connectors PC141 may be respectively connected to the plurality of first electrodes C141. On the contrary, the first connector PC141 may be formed as one sheet electrode, and thus the plurality of first electrodes C141 may be connected to one first connector PC141 of the sheet electrode type.

When the plurality of first connectors PC141 are provided, the first connectors PC141 may be formed in the same direction as the first electrodes C141 and also may be formed in a direction crossing the first electrodes C141. The first connector PC141 and the first electrode C141 may be electrically connected to each other in an overlap portion therebetween.

As shown in FIG. 3, the second auxiliary electrode P142 may include a second connector PC142 and a second pad PP142. As shown in FIGS. 1 and 2, the second connector PC142 may be connected to the plurality of second electrodes C142. Further, as shown in FIG. 3, one end of the second pad PP142 may be connected to an end of the second connector PC142, and the other end may be connected to the interconnector IC. The second connector PC142 may be formed in a direction crossing the second pad PP142. For example, the second connector PC142 may be formed perpendicular to the second pad PP142.

Namely, the second connector PC142 may be formed in the plural, and thus the plurality of second connectors PC142 may be respectively connected to the plurality of second electrodes C142. On the contrary, the second connector PC142 may be formed as one sheet electrode, and thus the plurality of second electrodes C142 may be connected to one second connector PC142 of the sheet electrode type.

When the plurality of second connectors PC142 are provided, the second connectors PC142 may be formed in the same direction as the second electrodes C142 and also may be formed in a direction crossing the second electrodes C142. The second connector PC142 and the second electrode C142 may be electrically connected to each other in an overlap portion therebetween.

The first auxiliary electrode P141 and the second auxiliary electrode P142 may be formed of at least one of Cu, Au, Ag, and Al.

As shown in FIG. 1 and (a) of FIG. 2, the first auxiliary electrode P141 may be electrically connected to the first electrode C141 using a conductive adhesive ECA formed of a conductive material, and the second auxiliary electrode P142 may be electrically connected to the second electrode C142 using the conductive adhesive ECA.

Further, as shown in FIG. 1 and (a) of FIG. 2, an insulating layer IL may be positioned between the first electrode C141 and the second electrode C142 and between the first auxiliary electrode P141 and the second auxiliary electrode P142, thereby preventing the short circuit.

More specifically, as shown in (b) of FIG. 2, the conductive adhesive ECA of the solar cell according to the embodiment of the invention may include a plurality of conductive metal particles ECA-CP and a resin layer ECA-I1 formed of an insulating material. The insulating layer IL may include an insulating resin layer IL-I2 formed of an insulating material and light reflection particles IL-AP reflecting light incident on the insulating resin layer IL-I2. The light reflection particles IL-AP are not indispensable and may be omitted, if necessary or desired.

The conductive metal particles ECA-CP and the resin layer ECA-I1 of the conductive adhesive ECA may be positioned between the first electrodes C141 and the first auxiliary electrode P141 and between the second electrodes C142 and the second auxiliary electrode P142. The conductive metal particles ECA-CP may be electrically connected to one another or may directly contact one another, thereby electrically connecting the first electrodes C141 to the first auxiliary electrode P141 and electrically connecting the second electrodes C142 to the second auxiliary electrode P142. The resin layer ECA-I1 may enhance an adhesive strength between the first electrodes C141 and the first auxiliary electrode P141 and an adhesive strength between the second electrodes C142 and the second auxiliary electrode P142.

Further, the insulating layer IL may be positioned between the first electrodes C141 and the second electrodes C142 and between the first auxiliary electrode P141 and the second auxiliary electrode P142. The insulating layer IL may prevent the short circuit between the first and second electrodes C141 and C142 and the short circuit between the first and second auxiliary electrodes P141 and P142 and also may further enhance an adhesive strength between the semiconductor substrate 110 and the insulating member 200.

A material of the conductive metal particles ECA-CP is not particularly limited as long as it is a conductive metal. For example, at least one of silver (Ag), nickel (Ni), copper (Cu), gold (Au), and aluminum (Al) may be used for the conductive metal particles ECA-CP.

A diameter of the conductive metal particle ECA-CP may be less than widths of the first and second electrodes C141 and C142 and widths of the first and second auxiliary electrodes P141 and P142. For example, the diameter of the conductive metal particle ECA-CP may be 0.1 μm to 15 μm.

Each of the resin layer ECA-I1 of the conductive adhesive ECA and the insulating resin layer IL-I2 of the insulating layer IL may contain at least one of an epoxy-based resin, an acrylic-based resin, and silicon-based resin.

Melting points of the conductive adhesive ECA and the insulating layer IL may be 130° C. to 250° C., and a melting point of the conductive metal particle ECA-CP may be higher than melting points of the resin layer ECA-I1 and the insulating layer IL.

The resin layer ECA-I1 of the conductive adhesive ECA and the insulating layer IL may contain the same resin material or different resin materials. However, when the resin layer ECA-I1 of the conductive adhesive ECA and the insulating layer IL contain the same resin material, it may be more advantageous to perform the alignment.

When the resin layer ECA-I1 of the conductive adhesive ECA and the insulating layer IL contain the same resin material in the process for attaching the insulating member 200 to the back surface of the semiconductor substrate 110, a melting point of the resin layer ECA-I1 of the conductive adhesive ECA may be equal to a melting point of the insulating layer IL. Hence, a thermal expansion coefficient and a thermal contraction coefficient of the resin layer ECA-I1 may be equal to those of the insulating layer IL. As a result, it may be more advantageous to perform the alignment between the first electrodes C141 and the first auxiliary electrode P141 and the alignment between the second electrodes C142 and the second auxiliary electrode P142.

Further, when the resin layer ECA-I1 of the conductive adhesive ECA and the insulating layer IL contain the same resin material in the process for attaching the insulating member 200 to the back surface of the semiconductor substrate 110, a chemical reaction between the resin material of the resin layer ECA-I1 and the resin material of the insulating layer IL may be further reduced. Hence, a phenomenon, such as the generation of bubbles, may be further reduced.

The light reflection particles IL-AP of the insulating layer IL may transmit the semiconductor substrate 110, may reflect light incident between the first and second electrodes C141 and C142, and may allow the reflected light to be again incident on the semiconductor substrate 110. The light reflection particles IL-AP may be formed of titanium oxide ($TiO_2$) particles or phosphor particles.

(b) of FIG. 2 shows that the insulating layer IL does not include conductive metal particles. However, on the contrary, the insulating layer IL may include the conductive metal particles. Because the conductive metal particles included in the insulating layer IL are separated from one another, they cannot connect the first and second electrodes C141 and C142 and cannot connect the first and second auxiliary electrodes P141 and P142. This is described in detail later.

FIGS. 1 and 2 show the overlap between the first electrode C141 and the first connector PC141 of the first auxiliary electrode P141 and the overlap between the second electrode C142 and the second connector PC142 of the second auxiliary electrode P142, as an example. However, the first electrode C141 may overlap the second connector PC142 of the second auxiliary electrode P142, and the second electrode C142 may overlap the first connector PC141 of the first auxiliary electrode P141. In this instance, the insulating layer IL for preventing the short circuit may be positioned between the first electrode C141 and the second connector PC142 and between the second electrode C142 and the first connector PC141.

The first auxiliary electrode P141 and the second auxiliary electrode P142 do not use a semiconductor manufacturing process and may be formed through a thermal process for applying heat of about 130° C. to 250° C. and a pressure to the conductive adhesive ECA.

The insulating member 200 may be disposed on back surfaces of the first auxiliary electrode P141 and the second auxiliary electrode P142.

A material of the insulating member 200 is not particularly limited as long as it is an insulating material. However, it may be preferable, but not required, that a melting point of the material of the insulating member 200 is higher than a melting point of the conductive adhesive ECA. For example, the insulating member 200 may be formed of a material having a melting point equal to or higher than about 300° C. More specifically, the insulating member 200 may be formed of at least one of polyimide, epoxy-glass, polyester, and bismaleimide triazine (BT) resin, each of which has a thermal resistance to a high temperature.

The insulating member 200 may be formed in the form of a flexible film or in the form of a hard plate which is not flexible.

In the solar cell according to the embodiment of the invention, each insulating member 200 and each semiconductor substrate 110 may be connected to each other to form an individual element in a state where the first and second auxiliary electrodes P141 and P142 are previously formed on a front surface of the insulating member 200 and the first and second electrodes C141 and C142 are previously formed on the back surface of the semiconductor substrate 110.

Namely, only one semiconductor substrate 110 may be attached and connected to one insulating member 200. In other words, one semiconductor substrate 110 and one insulating member 200 may be attached to each other to form an individual integrated type element, thereby forming a solar cell.

More specifically, the plurality of first electrodes C141 and the plurality of second electrodes C142 formed on a back surface of one semiconductor substrate 110 may be attached and electrically connected to the first auxiliary electrode P141 and the second auxiliary electrode P142 formed on a front surface of one insulating member 200 through a process for attaching one semiconductor substrate 110 to one insulating member 200 to form one individual integrated type element.

In the solar cell according to the embodiment of the invention, a thickness T2 of each of the first auxiliary electrode P141 and the second auxiliary electrode P142 may be greater than a thickness T1 of each of the first electrode C141 and the second electrode C142.

When the thickness T2 of each of the first connector PC141 and the second connector PC142 is greater than the thickness T1 of each of the first electrode C141 and the second electrode C142, a process time required to manufacture the solar cell may be further reduced. Further, a thermal expansion stress of the semiconductor substrate 110 may be further reduced than when the first electrode C141 and the second electrode C142 are directly formed on the back surface of the semiconductor substrate 110. Hence, the efficiency of the solar cell may be further improved. This is described in detail below.

An emitter region, a back surface field region, a first electrode connected to the emitter region, and a second electrode connected to the back surface field region, which are formed on a back surface of a semiconductor substrate, may be formed through a semiconductor process. In the semiconductor process, the first electrode and the second electrode may directly contact the back surface of the semiconductor substrate or may be very close to the back surface of the semiconductor substrate, and thus may be generally formed through a plating method, a physical vapor deposition (PVD) method, or a thermal process of a high temperature.

In this instance, the first and second electrodes have to be sufficiently thick, so as to sufficiently reduce resistances of the first and second electrodes.

However, when thicknesses of the first and second electrodes increase, a thermal expansion coefficient of the first and second electrodes containing a conductive metal material may be excessively greater than a thermal expansion coefficient of the semiconductor substrate.

Accordingly, when the first and second electrodes contract during the process for forming the first and second electrodes on the back surface of the semiconductor substrate through the thermal process of the high temperature, the semiconductor substrate cannot stand a thermal expansion stress. Hence, a fracture or a crack may be generated in the semiconductor substrate. As a result, yield of the manufacturing process of the solar cell may be reduced, and the efficiency of the solar cell may be reduced.

Further, when the first electrode or the second electrode is formed using the plating method or the PVD method, a growth speed of the first electrode or the second electrode may be very low. Hence, the manufacturing time of the solar cell may excessively increase.

On the other hand, in the solar cell according to the embodiment of the invention, the first and second connectors PC141 and PC142 each having the relatively large thickness T2 may be formed on the front surface of the insulating member 200 in a state where the first and second electrodes C141 and C142 each having the relatively small thickness T1 are formed on the back surface of the semiconductor substrate 110 and may overlap the first and second electrodes C141 and C142. Then, one semiconductor substrate 110 and one insulating member 200 may be attached to each other through the thermal process for applying the heat of about 130° C. to 250° C. and the pressure to the conductive adhesive ECA to form one individual integrated type element. Hence, a fracture or a crack may be prevented from being generated in the semiconductor substrate 110, and at the same time, the resistances of the electrodes formed on the back surface of the semiconductor substrate 110 may be greatly reduced.

Further, in the solar cell according to the embodiment of the invention, time required in the semiconductor manufacturing process may be reduced by relatively reducing the thicknesses T1 of the first and second electrodes C141 and C142. The connection between the first electrode C141 and the first auxiliary electrode P141 and the connection between the second electrode C142 and the second auxiliary electrode P142 may be performed through one thermal process, and thus the manufacturing time of the solar cell may be further reduced.

In this instance, the insulating member 200 functions to facilitate the process performed when the first auxiliary electrode P141 and the second auxiliary electrode P142 are attached to the first electrode C141 and the second electrode C142 formed on the back surface of the semiconductor substrate 110.

Namely, when the front surface of the insulating member 200, on which the first auxiliary electrode P141 and the second auxiliary electrode P142 are formed, is attached and connected to the back surface of the semiconductor substrate 110, on which the first electrode C141 and the second electrode C142 are formed, through the semiconductor manufacturing process, the insulating member 200 may help in more easily performing an alignment process or an attachment process.

In the solar cell according to the embodiment of the invention thus manufactured, holes collected by the first auxiliary electrode P141 and electrons collected by the second auxiliary electrode P142 may be used as electric power of an external device through an external circuit device.

So far, the embodiment of the invention described that the semiconductor substrate 110 is a crystalline silicon semiconductor substrate and the emitter regions 121 and the back surface field regions 172 are formed through a diffusion process, as an example.

However, on the contrary, the embodiment of the invention may be equally applied to a heterojunction solar cell, in which an emitter region and a back surface field region, each of which is formed of amorphous silicon, are formed on a crystalline silicon semiconductor substrate, or a solar cell, in which an emitter region is formed on a front surface of a semiconductor substrate and is connected to a first electrode formed on a back surface of the semiconductor substrate through a plurality of via holes of the semiconductor substrate.

The plurality of solar cells each having the above-described structure may be connected in series to one another through the interconnector IC.

In the solar cell having the above-described structure, a pattern of the first and second electrodes C141 and C142 formed on the back surface of the semiconductor substrate 110 and a pattern of the first and second auxiliary electrodes P141 and P142 formed on the front surface of the insulating member 200 are described in detail below.

The front surface of the insulating member 200 having the structure shown in (c) and (d) of FIG. 3 may be attached and connected to the back surface of the semiconductor substrate 110 having the structure shown in (a) and (b) of FIG. 3, thereby forming the individual integrated type element as the solar cell according to the embodiment of the invention. Namely, the insulating member 200 and the semiconductor substrate 110 may have one-to-one connection.

In this instance, as shown in (a) and (b) of FIG. 3, the plurality of first electrodes C141 and the plurality of second electrodes C142 may be formed on the back surface of the semiconductor substrate 110 shown in FIGS. 1 and 2 to be separated from each other and may extend in the first direction x.

Further, as shown in (c) and (d) of FIG. 3, the first auxiliary electrode P141 and the second auxiliary electrode P142 may be formed on the front surface of the insulating member 200.

As described above, the first auxiliary electrode P141 may include the first connectors PC141 and the first pad PP141. As shown in (c) of FIG. 3, the first connectors PC141 may extend in the first direction x, and the first pad PP141 may extend in the second direction y. One end of the first pad PP141 may be connected to ends of the first connectors PC141, and the other end may be connected to the interconnector IC.

Further, the second auxiliary electrode P142 may include the second connectors PC142 and the second pad PP142. As shown in (c) of FIG. 3, the second connectors PC142 may be separated from the first connectors PC141 and may extend in the first direction x, and the second pad PP142 may extend in the second direction y. One end of the second pad PP142 may be connected to ends of the second connectors PC142, and the other end may be connected to the interconnector IC.

In the embodiment disclosed herein, the first connectors PC141 may be separated from the second pad PP142, and the second connectors PC142 may be separated from the first pad PP141. When the first connector PC141 is formed in the plural, and when the second connector PC142 is formed in the plural, the first connector PC141 and the second connector PC142 may be parallel and may be interdigitated.

Accordingly, the first pad PP141 may be formed at one end of the first direction x on the front surface of the insulating member 200, and the second pad PP142 may be formed at the other end of the first direction x on the front surface of the insulating member 200.

As described above, the solar cell according to the embodiment of the invention may form an individual integrated type element by attaching only one insulating member 200 to one semiconductor substrate 110, thereby more easily performing a manufacturing process of a solar cell module. Further, even if the semiconductor substrate 110 included in any one solar cell is broken or damaged in the manufacturing process of the solar cell module, only the corresponding solar cell forming the individual integrated type element using the broken or damaged semiconductor substrate 110 may be replaced. Hence, the process yield of the solar cell module may be further improved.

Further, the solar cell forming the individual integrated type element may minimize a thermal expansion stress applied to the semiconductor substrate 110 when the solar cell or the solar cell module is manufactured.

When an area of the insulating member 200 is equal to or greater than an area of the semiconductor substrate 110, a formation space of the interconnector IC for connecting the adjacent solar cells may be sufficiently secured in the front surface of the insulating member 200. Thus, the area of the insulating member 200 may be greater than the area of the semiconductor substrate 110.

For this, a length of the insulating member 200 in the first direction x may be longer than a length of the semiconductor substrate 110 in the first direction x.

In the embodiment disclosed herein, the front surface of the insulating member 200 may be attached to the back surface of the semiconductor substrate 110. Hence, the first electrodes C141 may be connected to the first auxiliary electrode P141, and the second electrodes C142 may be connected to the second auxiliary electrode P142.

Figure 4:
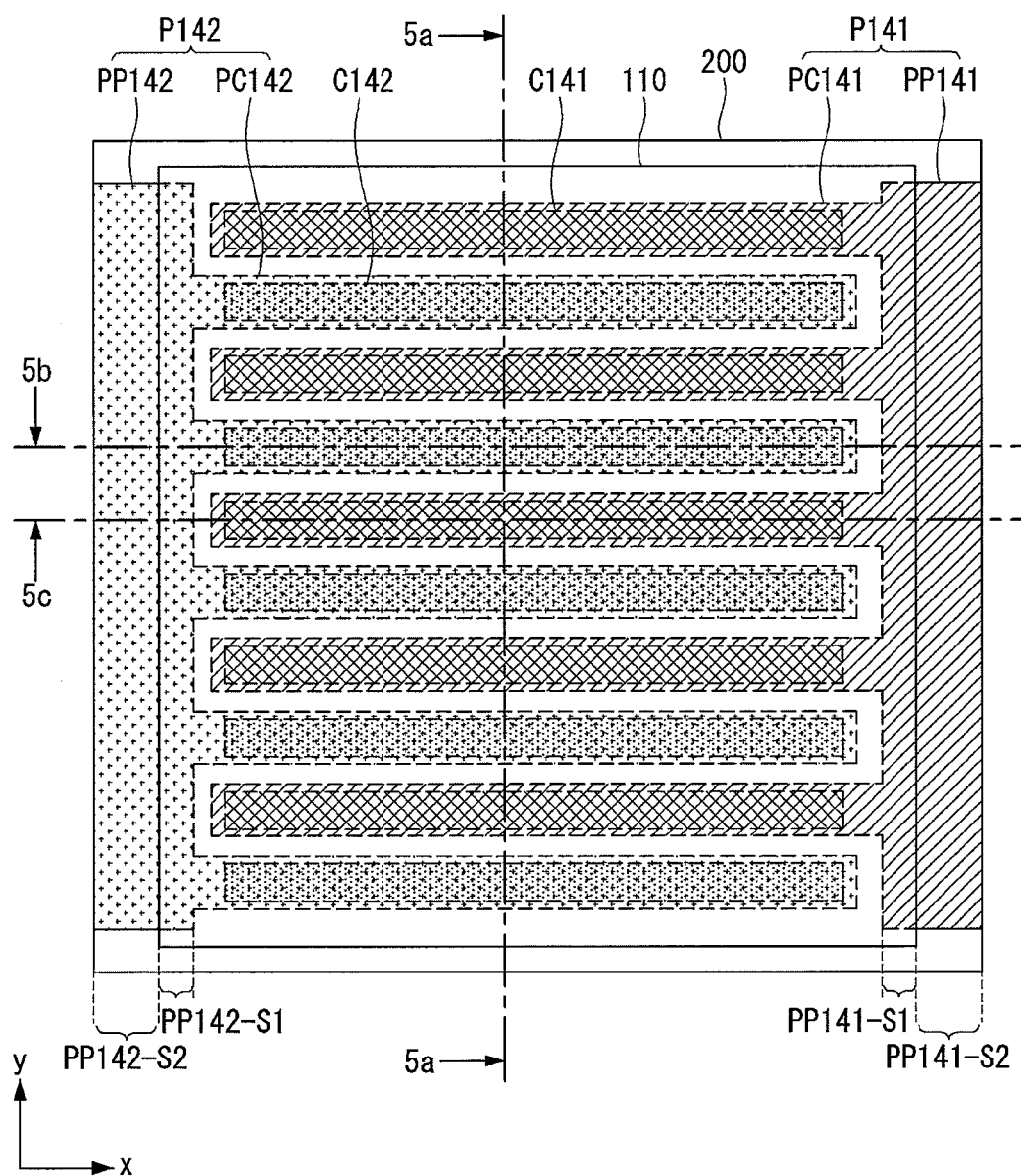
FIG. 4 shows a state where one semiconductor substrate and one insulating member shown in FIG. 3 are connected.
Figure 5A:
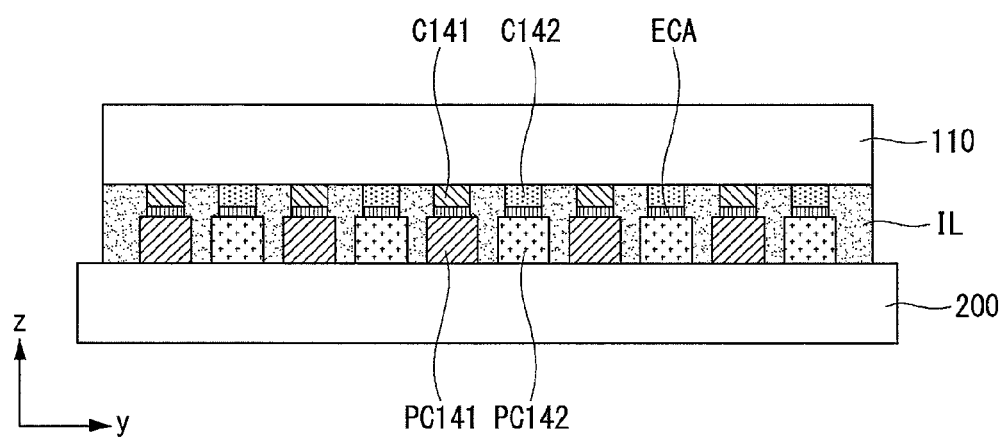
FIG. 5A is a cross-sectional view taken along line 5a-5a of FIG. 4.
Figure 5B:
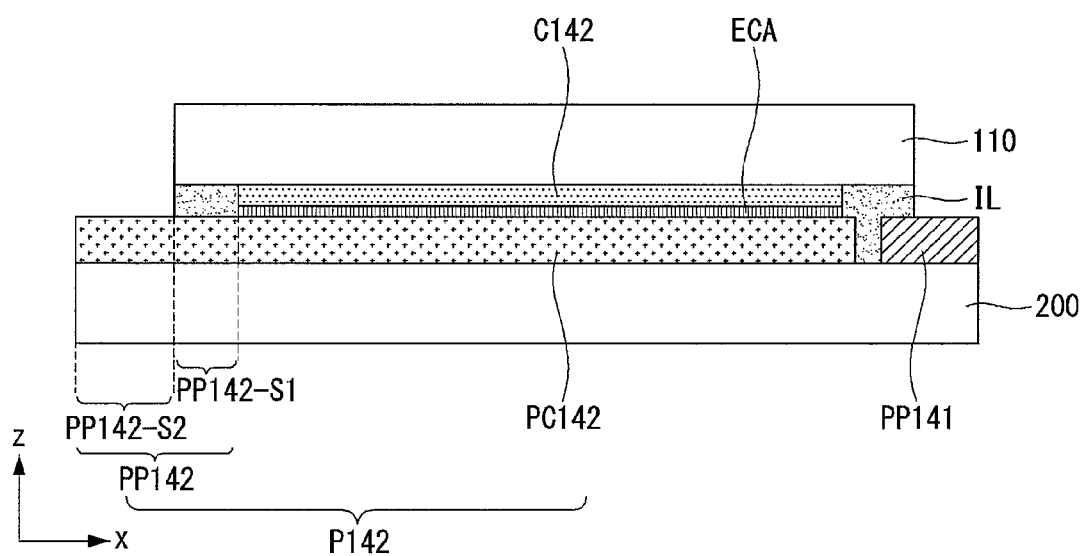
FIG. 5B is a cross-sectional view taken along line 5b-5b of FIG. 4.
Figure 5C:
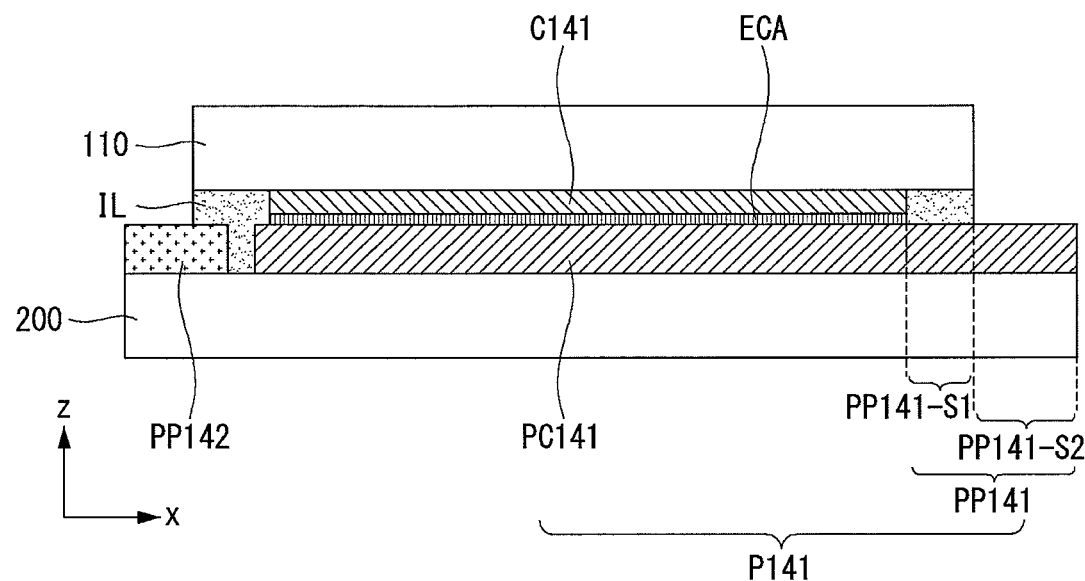
FIG. 5C is a cross-sectional view taken along line 5c-5c of FIG. 4.

FIG. 4 shows a state where one semiconductor substrate 110 and one insulating member 200 shown in FIG. 3 are connected. FIG. 5A is a cross-sectional view taken along line 5a-5a of FIG. 4; FIG. 5B is a cross-sectional view taken along line 5b-5b of FIG. 4; and FIG. 5C is a cross-sectional view taken along line 5c-5c of FIG. 4.

As shown in FIG. 4, the semiconductor substrate 110 may completely overlap the insulating member 200 to form an individual solar cell element.

For example, as shown in FIG. 5A, the first electrode C141 formed on the back surface of the semiconductor substrate 110 and the first connector PC141 formed on the front surface of the insulating member 200 may overlap each other and may be electrically connected to each other using the conductive adhesive ECA.

Further, the second electrode C142 formed on the back surface of the semiconductor substrate 110 and the second connector PC142 formed on the front surface of the insulating member 200 may overlap each other and may be electrically connected to each other using the conductive adhesive ECA.

A space between the first electrode C141 and the second electrode C142 may be filled with the insulating layer IL, and also a space between the first connector PC141 and the second connector PC142 may be filled with the insulating layer IL.

As shown in FIG. 5B, a space between the second connector PC142 and the first pad PP141 may be filled with the insulating layer IL. As shown in FIG. 5C, a space between the first connector PC141 and the second pad PP142 may be filled with the insulating layer IL.

As shown in FIG. 4, the first pad PP141 and the second pad PP142 may respectively include first areas PP141-S1 and PP142-S1 overlapping the semiconductor substrate 110 and exposure areas PP141-S2 and PP142-S2 not overlapping the semiconductor substrate 110.

The interconnector IC may be connected to the exposure area PP141-S2 of the first pad PP141 and the exposure area PP142-S2 of the second pad PP142, which are provided to secure a connection space of the interconnector IC.

Because the first pad PP141 and the second pad PP142 according to the embodiment of the invention respectively include the exposure areas PP141-S2 and PP142-S2, the connection of the interconnector IC may be more easily performed. Further, when the interconnector IC is connected to the insulating member 200, the thermal expansion stress of the semiconductor substrate 110 may be minimized.

Thus, the interconnector IC may be connected to the first pad PP141 or the second pad PP142 of the insulating member 200, thereby connecting the plurality of solar cells.

So far, the embodiment of the invention described that the first and second electrodes C141 and C142 formed on the semiconductor substrate 110 and the first and second connectors PC141 and PC142 formed on the insulating member 200 overlap each other and are connected to each other in a direction parallel to each other. However, on the contrary, the first and second electrodes C141 and C142 formed on the semiconductor substrate 110 and the first and second connectors PC141 and PC142 formed on the insulating member 200 may overlap each other and may be connected to each other in a cross direction therebetween.

Further, each of the first and second connectors PC141 and PC142 is not formed in the plural and may be formed as one sheet electrode. The plurality of first electrodes C141 and the plurality of second electrodes C142 may be connected to the first connector PC141 and the second connector PC142, each of which is the sheet electrode.

So far, the embodiment of the invention described one first pad PP141 and one second pad PP142. However, on the contrary, each of the first pad PP141 and the second pad PP142 may be formed in the plural. In this instance, the plurality of first connectors PC141 and the plurality of second connectors PC142 may be connected to the plurality of first pads PP141 and the plurality of second pads PP142.

Further, FIGS. 1 to 5C show the solar cell according to the embodiment of the invention including the insulating member 200. However, on the contrary, after the first and second electrodes C141 and C142 are connected to the first and second auxiliary electrodes P141 and P142 by attaching the insulating member 200 to the back surface of the semiconductor substrate 110, the insulating member 200 may be removed. As described above with reference to FIGS. 1 to 5C, the interconnector IC may be connected to the first auxiliary electrode P141 or the second auxiliary electrode P142 in a state where the insulating member 200 is removed.

So far, the structure of the solar cell according to the embodiment of the invention was described. Hereinafter, a method for connecting the semiconductor substrate 110 to the insulating member 200 using the conductive adhesive ECA and the insulating layer IL is described.

Figure 6A:
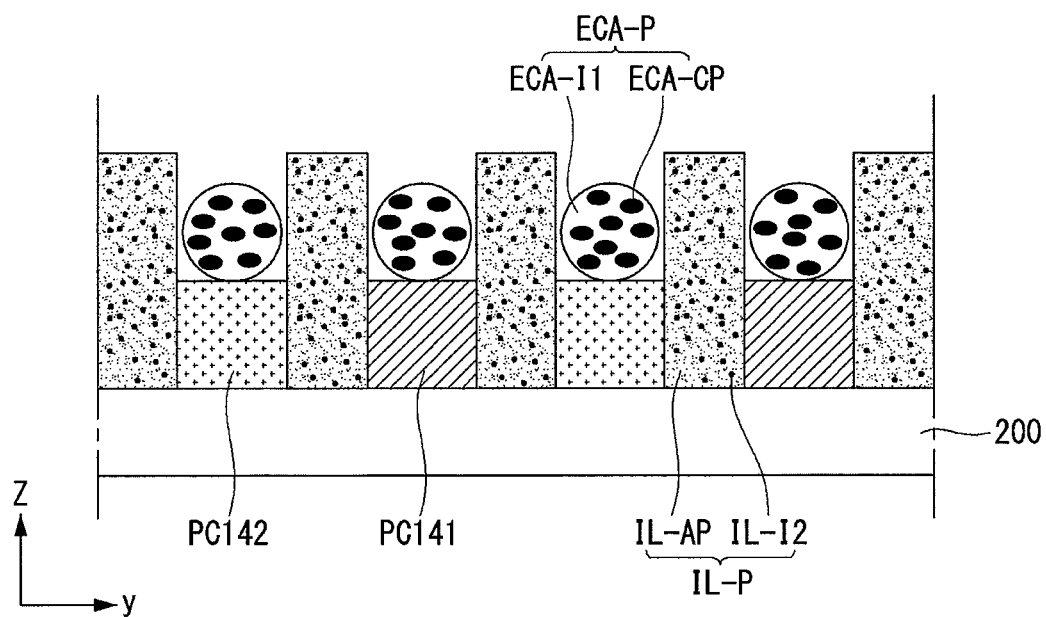
FIGS. 6A to 6C show an example of a method for connecting a semiconductor substrate and an insulating member so as to form the solar cell shown in FIGS. 1 to 5C.
Figure 6B:
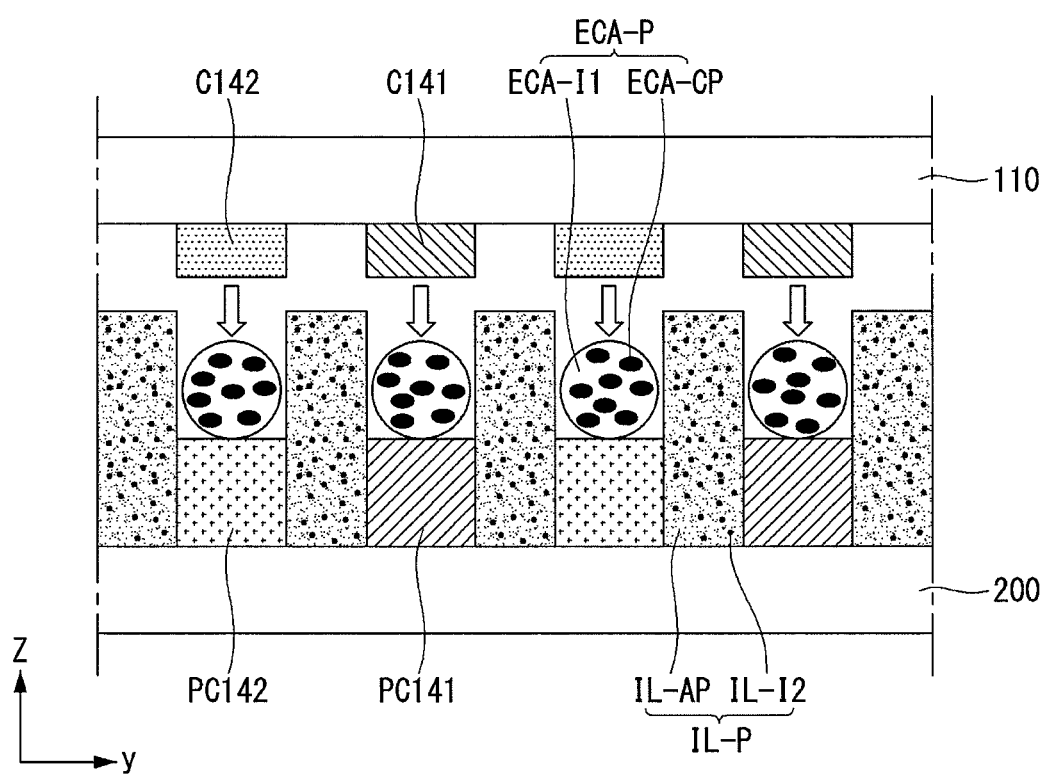
Figure 6C:
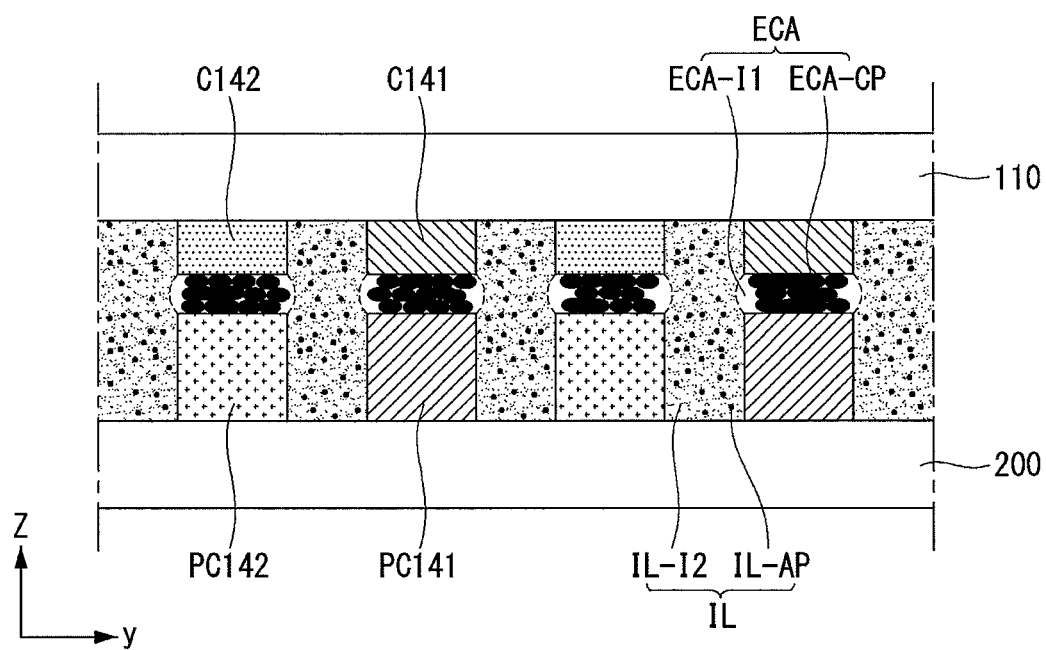

FIGS. 6A to 6C illustrate an example of a method for connecting the semiconductor substrate and the insulating member so as to form an individual integrated type element as the solar cell shown in FIGS. 1 to 5C.

First, as described above with reference to (a) of FIG. 3, the semiconductor substrate 110, on which the plurality of first electrodes C141 and the plurality of second electrodes C142 are formed to be separated from each other on its back surface, is prepared. As described above with reference to (c) of FIG. 3, the insulating member 200, on which the first auxiliary electrode P141 and the second auxiliary electrode P142 are formed to be separated from each other on its front surface, is prepared.

As shown in FIG. 6A, an insulating layer paste IL-P including the insulating resin layer IL-I2 and the light reflection particles IL-AP may be applied between the first and second auxiliary electrodes P141 and P142, and a conductive adhesive paste ECA-P including the conductive metal particles ECA-CP and the resin layer ECA-I1 may be applied on each of the first and second auxiliary electrodes P141 and P142, so as to connect the semiconductor substrate 110 to the insulating member 200. However, unlike FIG. 6A, the insulating layer paste IL-P may be applied between the first and second electrodes C141 and C142 of the semiconductor substrate 110, and the conductive adhesive paste ECA-P may be applied on each of the first and second electrodes C141 and C142.

In the embodiment disclosed herein, an application height of the insulating layer paste IL-P applied to the insulating member 200 may be greater than an application height of the conductive adhesive paste ECA-P applied to the insulating member 200.

Next, as shown in FIG. 6B, the first and second electrodes C141 and C142 formed on the back surface of the semiconductor substrate 110 may be disposed in an arrow direction, so that they are aligned with the first and second auxiliary electrodes P141 and P142.

Next, as shown in FIG. 6C, heat of about 130° C. to 250° C. and pressure are applied to the insulating layer paste IL-P and the conductive adhesive paste ECA-P, and then the insulating layer paste IL-P and the conductive adhesive paste ECA-P are cooled. Hence, the conductive adhesive ECA and the insulating layer IL may be formed between the semiconductor substrate 110 and the insulating member 200.

As a result, the insulating member 200 may be connected to the back surface of the semiconductor substrate 110. The first electrodes C141 may be connected to the first auxiliary electrode P141 using the conductive adhesive ECA, and the second electrodes C142 may be connected to the second auxiliary electrode P142 using the conductive adhesive ECA. Further, the first and second electrodes C141 and C142 may be insulated from each other through the insulating layer IL, and the first and second auxiliary electrodes P141 and P142 may be insulated from each other through the insulating layer IL.

A material of the resin layer ECA-I1 included in the conductive adhesive paste ECA-P may be the same as a material of the insulating resin layer IL-I2 included in the insulating layer paste IL-P. Thus, in the thermal process of about 130° C. to 250° C., a thermal expansion coefficient of the resin layer ECA-I1 included in the conductive adhesive paste ECA-P may be equal to a thermal expansion coefficient of the insulating resin layer IL-I2 included in the insulating layer paste IL-P. Hence, the alignment between the first electrodes C141 and the first auxiliary electrode P141 and the alignment between the second electrodes C142 and the second auxiliary electrode P142 may be more precisely performed.

The method for connecting the semiconductor substrate 110 to the insulating member 200 according to the embodiment of the invention may simultaneously harden or semi-harden the resin layer ECA-I1 of the conductive adhesive paste ECA-P and the insulating resin layer IL-I2 of the insulating layer paste IL-P through one thermal process by forming the resin layer ECA-I1 of the conductive adhesive paste ECA-P and the insulating resin layer IL-I2 of the insulating layer paste IL-P using the same material. Hence, the manufacturing process of the solar cell according to the embodiment of the invention may be further simplified.

Namely, when the material of the resin layer ECA-I1 of the conductive adhesive paste ECA-P is different from the material of the insulating resin layer IL-I2 of the insulating layer paste IL-P, a hardening process of two steps has to be performed. However, the method for manufacturing the solar cell according to the embodiment of the invention may simultaneously harden or semi-harden the resin layer ECA-I1 of the conductive adhesive paste ECA-P and the insulating resin layer IL-I2 of the insulating layer paste IL-P through one thermal process.

Hence, the semiconductor substrate 110 and the insulating member 200 may be connected to each other. As a result, the method for manufacturing the solar cell according to the embodiment of the invention may be further simplified.

FIG. 6A shows that the conductive adhesive paste ECA-P and the insulating layer paste IL-P are applied to the insulating member 200, as an example. However, on the contrary, the conductive adhesive paste ECA-P and the insulating layer paste IL-P may be applied to the back surface of the semiconductor substrate 110, on which the first and second electrodes C141 and C142 are formed.

FIGS. 6A to 6C show that the conductive adhesive ECA of the conductive paste type is used to connect the semiconductor substrate 110 and the insulating member 200, as an example. However, on the contrary, a conductive adhesive film including conductive metal particles and a resin layer may be used to connect the semiconductor substrate 110 and the insulating member 200.

Figure 7:
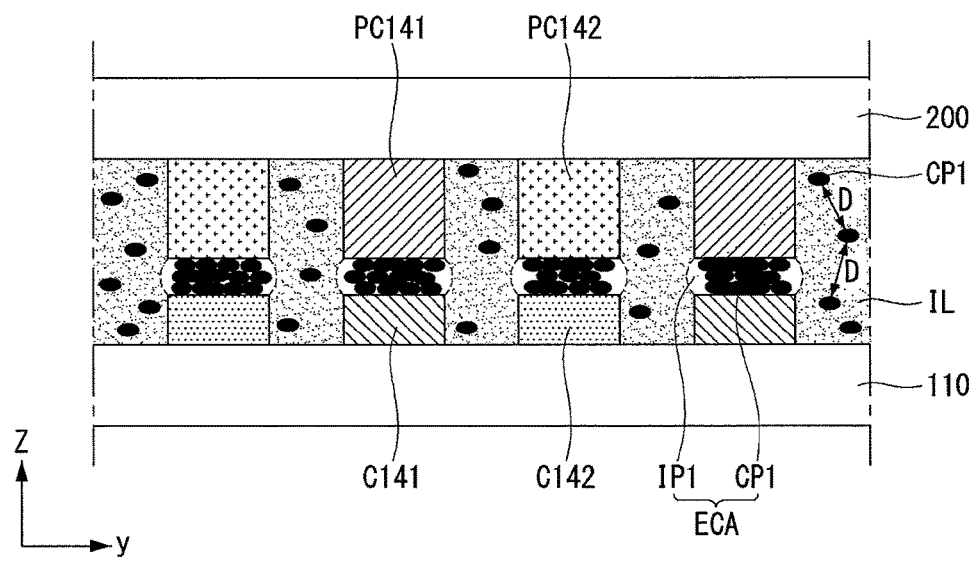
FIG. 7 and FIGS. 8A and 8B show another example of a method for connecting a semiconductor substrate and an insulating member in a solar cell according to an example embodiment of the invention.
Figure 8A:
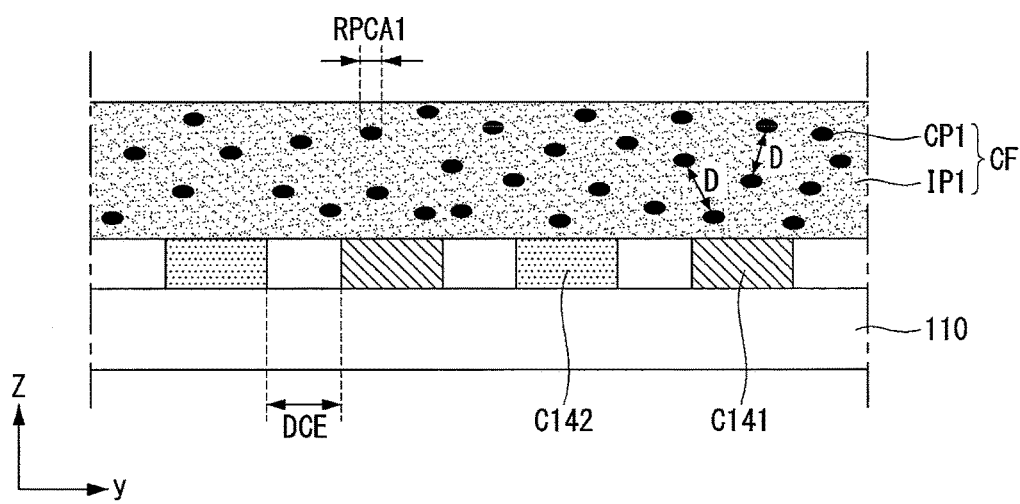
Figure 8B:
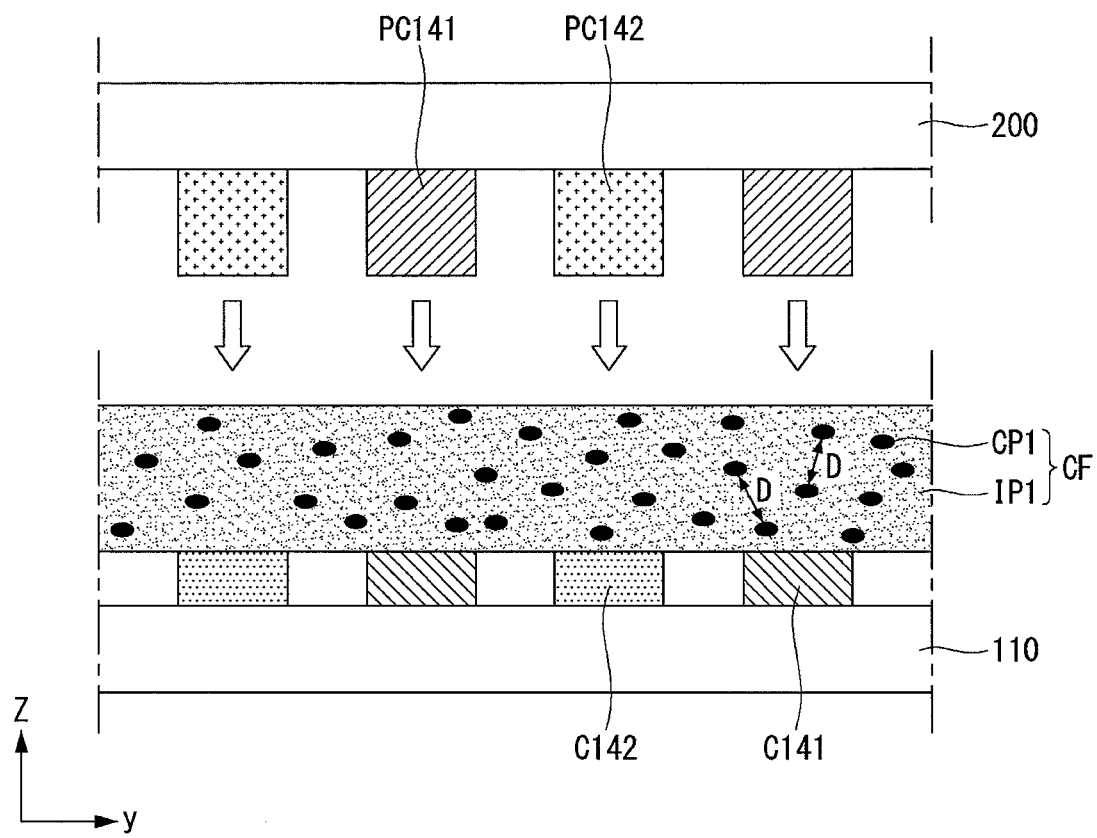

FIG. 7 and FIGS. 8A and 8B show another example of a method for connecting the semiconductor substrate and the insulating member in the solar cell according to the embodiment of the invention.

More specifically, FIG. 7 shows that the semiconductor substrate 110 and the insulating member 200 are connected to each other using a conductive adhesive film. FIGS. 8A and 8B show another example of a method for connecting the semiconductor substrate 110 and the insulating member 200 using the conductive adhesive film.

Even when the semiconductor substrate 110 and the insulating member 200 are connected to each other using a conductive adhesive film including conductive metal particles and a resin layer, a conductive adhesive ECA having the conductive adhesive film type may include conductive metal particles CP1 and a resin layer IP1.

However, unlike (b) of FIG. 2 and FIG. 6C, the plurality of conductive metal particles CP1 may be positioned inside the insulating layer IL formed of the resin material and may be separated from one another.

More specifically, as shown in FIG. 7, in the solar cell according to the embodiment of the invention, the plurality of conductive metal particles CP1 may be formed between the first and second electrodes C141 and C142 and between the first and second auxiliary electrodes P141 and P142 as well as between the first electrode C141 and the first auxiliary electrode P141 and between the second electrode C142 and the second auxiliary electrode P142.

The plurality of conductive metal particles CP1 positioned between the first electrode C141 and the first auxiliary electrode P141 and between the second electrode C142 and the second auxiliary electrode P142 may directly contact one another and may be electrically connected to one another. Hence, the plurality of first electrodes C141 may be connected to the first auxiliary electrode P141, and the plurality of second electrodes C142 may be connected to the second auxiliary electrode P142.

However, the plurality of conductive metal particles CP1 positioned between the first and second electrodes C141 and C142 and between the first and second auxiliary electrodes P141 and P142 are separated from one another inside the insulating layer IL. Therefore, the first and second electrodes C141 and C142 are not short-circuited and may be insulated from each other, and the first and second auxiliary electrodes P141 and P142 are not short-circuited and may be insulated from each other.

In this instance, because the resin layer IP1 included in the conductive adhesive ECA and an insulating resin layer included in the insulating layer IL are formed using the same conductive adhesive film, they may be formed of the same material.

The method for connecting the semiconductor substrate 110 to the insulating member 200 using the conductive adhesive film including the conductive metal particles and the resin layer is described below.

First, as shown in FIG. 8A, a conductive adhesive film CF including conductive metal particles CP1 and a resin layer IP1 is disposed on the back surface of the semiconductor substrate 110, on which the first and second electrodes C141 and C142 are formed.

Next, as shown in FIG. 8B, the insulating member 200, on which the first and second auxiliary electrodes P141 and P142 are formed, is aligned with the back surface of the semiconductor substrate 110, on which the conductive adhesive film CF is disposed, and is disposed in an arrow direction. Then, heat and pressure may be simultaneously applied to the semiconductor substrate 110 and the insulating member 200 to connect the insulating member 200 to the back surface of the semiconductor substrate 110.

In this instance, the conductive metal particles CP1 may be adhered and electrically connected to one another between the first electrode C141 and the first auxiliary electrode P141 and between the second electrode C142 and the second auxiliary electrode P142 through the pressure, thereby electrically connecting the first electrode C141 to the first auxiliary electrode P141 and electrically connecting the second electrode C142 to the second auxiliary electrode P142. Further, the conductive metal particles CP1 may be separated from one another between the first and second electrodes C141 and C142 and between the first and second auxiliary electrodes P141 and P142, thereby insulating the first and second electrodes C141 and C142 from each other and insulating the first and second auxiliary electrodes P141 and P142 from each other.

A temperature used in the thermal process may be about 130° C. to 250° C. or may be less than about 130° C.

As described above, when the conductive adhesive film CF is used, the process for connecting the semiconductor substrate 110 and the insulating member 200 may be further simplified.

As described above, when each semiconductor substrate 110 and each insulating member 200 are connected to form one solar cell, the adjacent solar cells may be connected to each other through the interconnector.

Hereinafter, an example of a solar cell module formed using the solar cells according to the embodiment of the invention is described.

Figure 9:
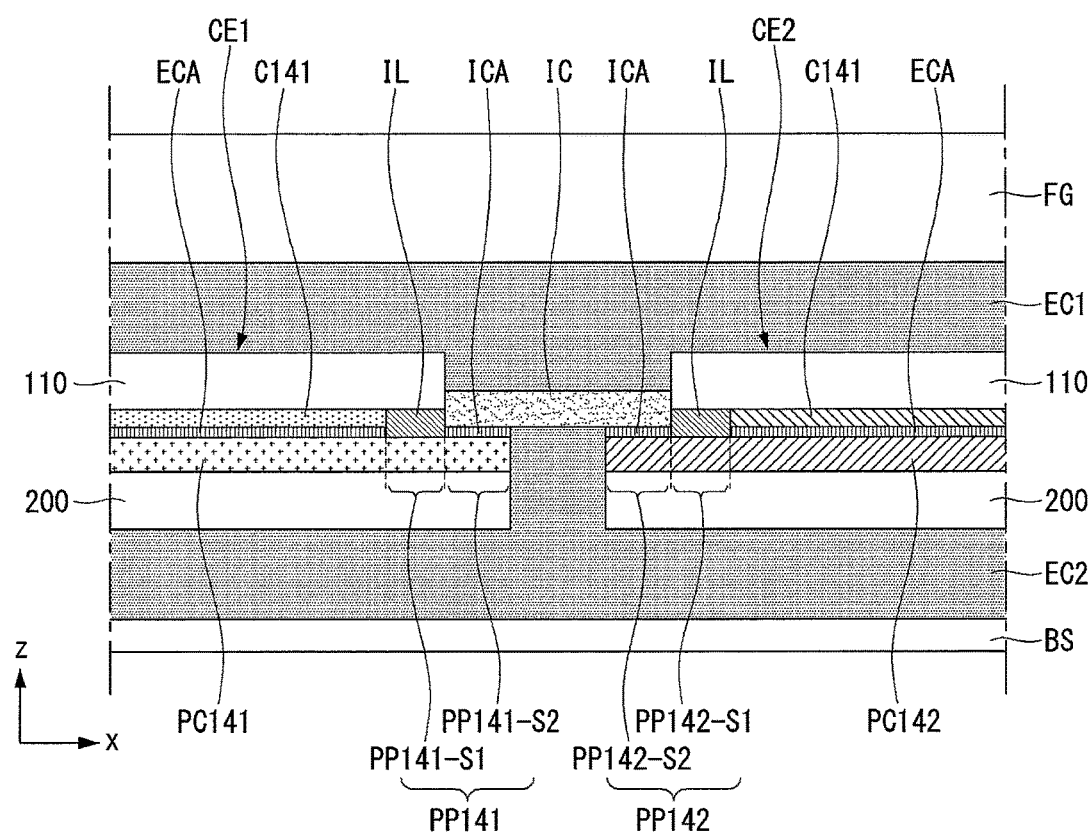
FIG. 9 shows an example of a solar cell module including solar cells, each of which is formed as an individual integrated type element by connecting each semiconductor substrate and each insulating member.

FIG. 9 shows an example of a solar cell module including solar cells, each of which is formed as an individual integrated type element by connecting each semiconductor substrate and each insulating member.

As shown in FIG. 9, a solar cell module according to the embodiment of the invention may include a front glass substrate FG, an upper encapsulant EC1, a plurality of solar cells including a first solar cell CE1 and a second solar cell CE2, an interconnector IC for electrically connecting the first solar cell CE1 to the second solar cell CE2, a lower encapsulant EC2, and a back sheet BS.

Each of the plurality of solar cells including the first solar cell CE1 and the second solar cell CE2 may include a plurality of first electrodes C141 formed on a back surface of a semiconductor substrate 110, a plurality of second electrodes C142 formed on the back surface of the semiconductor substrate 110, a first auxiliary electrode P141 connected to the plurality of first electrodes C141, a second auxiliary electrode P142 connected to the plurality of second electrodes C142, and an insulating member 200 positioned on back surfaces of the first auxiliary electrode P141 and the second auxiliary electrode P142. Since the configuration of the solar cell is described above in detail, a further description thereof may be omitted.

The interconnector IC may electrically connect the first solar cell CE1 to the second solar cell CE2. More specifically, as shown in FIG. 9, the interconnector IC may be connected to a pad (i.e., a first pad PP141) of the first auxiliary electrode P141 or a pad (i.e., a second pad PP142) of the second auxiliary electrode P142 of each solar cell.

FIG. 9 shows that the interconnector IC is not separated from the semiconductor substrate 110. However, on the contrary, the interconnector IC and the semiconductor substrate 110 may be separated from each other, so as to prevent the short circuit between the interconnector IC and the semiconductor substrate 110 and further improve an optical gain due to the interconnector IC.

Further, FIG. 9 shows that a front surface of the interconnector IC is flat. However, on the contrary, the front surface of the interconnector IC may have an uneven surface having a plurality of uneven portions or having uneven characteristics, so as to improve the optical gain due to the interconnector IC.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
   a semiconductor substrate;
   a plurality of first electrodes and a plurality of second electrodes which are formed to be separated from each other on a back surface of the semiconductor substrate;
   an insulating member including a first auxiliary electrode connected to the plurality of first electrodes and a second auxiliary electrode connected to the plurality of second electrodes; and
   an interconnector connected to the first auxiliary electrode and the second auxiliary electrode for connecting adjacent two solar cells of a plurality of solar cells;
   wherein the plurality of first electrodes and the first auxiliary electrode are connected to each other using a conductive adhesive including a resin layer and conductive metal particles distributed in the resin layer, and the plurality of second electrodes and the second auxiliary electrode are connected to each other using the conductive adhesive,
   wherein the plurality of first and second electrodes are insulated from each other through an insulating layer, or the first and second auxiliary electrodes are insulated from each other through the insulating layer, and the insulating layer bonds the insulating member to the semiconductor substrate,
   wherein the resin layer included in the conductive adhesive and the insulating layer contain the same resin material,
   wherein the insulating layer includes light reflection particles to reflect incident light, and
   wherein the interconnector is positioned between two semiconductor substrates of the adjacent two solar cells and is not overlapped with the two semiconductor substrates when viewed from a direction perpendicular to a major surface of the two semiconductor substrates and the interconnector further has a non-overlapped portion that is not overlapped with the insulating member.

2. The solar cell module of claim 1, wherein the resin layer of the conductive adhesive and the insulating layer each contain at least one of an epoxy-based resin, an acrylic-based resin, and a silicon-based resin.

3. The solar cell module of claim 2, wherein one semiconductor substrate and one insulating member are connected to form an individual integrated type element.

4. The solar cell module of claim 1, wherein the light reflection particles are formed of titanium oxide ($TiO_2$) particles or phosphor particles.

5. The solar cell module of claim 1, wherein a size of each conductive metal particle is 0.1 μm to 15 μm.

6. The solar cell module of claim 1, wherein the conductive metal particles contain at least one of silver (Ag), nickel (Ni), copper (Cu), gold (Au), and aluminum (Al).

7. The solar cell module of claim 1, wherein the insulating layer includes a plurality of conductive metal particles which are positioned to be separated from one another.

8. The solar cell module of claim 1, wherein the first auxiliary electrode includes a first connector connected to the first electrodes and a first pad, one end of which is connected to an end of the first connector, and
   wherein the second auxiliary electrode includes a second connector connected to the second electrodes and a second pad, one end of which is connected to an end of the second connector.

9. The solar cell module of claim 8, wherein the interconnector for connecting the two adjacent solar cells is connected to the first pad and the second pad.

* * * * *